United States Patent
Lin et al.

(10) Patent No.: US 8,603,879 B2
(45) Date of Patent: Dec. 10, 2013

(54) METHOD FOR FABRICATING SUPER-JUNCTION POWER DEVICE WITH REDUCED MILLER CAPACITANCE

(71) Applicant: Anpec Electronics Corporation, Hsin-Chu (TW)

(72) Inventors: Yung-Fa Lin, Hsinchu (TW); Shou-Yi Hsu, Hsinchu (TW); Meng-Wei Wu, Hsinchu (TW); Yi-Chun Shih, Nantou County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/894,443

(22) Filed: May 15, 2013

(65) Prior Publication Data

US 2013/0260523 A1    Oct. 3, 2013

Related U.S. Application Data

(62) Division of application No. 13/234,132, filed on Sep. 15, 2011.

(30) Foreign Application Priority Data

May 19, 2011   (TW) .............................. 100117647 A (51) Int. Cl.
*H01L 21/336*   (2006.01)

(52) U.S. Cl.
USPC ........... 438/270; 438/272; 438/429; 438/430; 438/431; 257/328; 257/329; 257/330; 257/E21.41

(58) Field of Classification Search
USPC .......... 438/270, 272, 429, 430, 431; 257/328, 257/329, 330, E21.41, E21.546
See application file for complete search history.

(56) References Cited

U.S. PATENT DOCUMENTS

| | | | |
|---|---|---|---|
| 5,468,982 A | 11/1995 | Hshieh | |
| 6,444,528 B1 * | 9/2002 | Murphy | 438/270 |
| 7,652,326 B2 | 1/2010 | Kocon | |
| 2003/0194843 A1 * | 10/2003 | Thapar | 438/270 |

* cited by examiner

*Primary Examiner* — Thinh T Nguyen
(74) *Attorney, Agent, or Firm* — Winston Hsu; Scott Margo (57) ABSTRACT

A method for fabricating a super-junction semiconductor power device with reduced Miller capacitance includes the following steps. An N-type substrate is provided and a P-type epitaxial layer is formed on the N-type substrate. At least a trench is formed in the P-type epitaxial layer followed by forming a buffer layer on interior surface in the trench. An N-type dopant layer is filled into the trench and then the N-type dopant layer is etched to form a recessed structure at an upper portion of the trench. A gate oxide layer is formed, and simultaneously, dopants in the N-type dopant layer diffuse into the P-type epitaxial layer, forming an N-type diffusion layer. Finally, a gate conductor is filled into the recessed structure and an N-type source doped region is formed around the gate conductor in the P-type epitaxial layer.

11 Claims, 11 Drawing Sheets

METHOD FOR FABRICATING SUPER-JUNCTION POWER DEVICE WITH REDUCED MILLER CAPACITANCE

CROSS REFERENCE TO RELATED APPLICATIONS

This application is a division of U.S. application Ser. No. 13/234,132 filed Sep. 15, 2011.

BACKGROUND OF THE INVENTION

1. Field of the Invention

The present invention generally relates to the field of semiconductor power devices. More particularly, the present invention relates to a method for fabricating a super-junction semiconductor power device with reduced Miller capacitance.

2. Description of the Prior Art

A power device is used in power management; for example, in a switching power supply, a management integrated circuit in the core or peripheral region of a computer, a backlight power supply, and in an electric motor control. The type of power devices described above include an insulated gate bipolar transistor (IGBT), a metal-oxide-semiconductor field effect transistor (MOSFET), and a bipolar junction transistor (BJT), among which the MOSFET is the most widely applied because of its energy saving properties and ability to provide faster switching speeds.

In one kind of power MOSFET device, a P-type epitaxial layer and an N-type epitaxial layer are alternatively disposed to form several PN junctions inside a body and the junctions are vertical to a surface of the body. The device with the described PN junctions is also called a super-junction power MOSFET device. A gate structure is disposed at a cell region of the device to control the on-off state of current. In a conventional super-junction power device, there are some disadvantages to be conquered. For example, a channel length is not easily controlled, which causes the fluctuation of a threshold voltage. A super-junction power MOSFET of the prior art usually has a relatively high Miller capacitance so switching loss is inevitable, and this further reduces the performance of the device.

In light of the above, there is still a need for providing a method for fabricating an improved super-junction power MOSFET which is capable of overcoming the shortcomings and deficiencies of the prior art.

SUMMARY OF THE INVENTION

It is therefore one objective of the invention to provide a method for fabricating a super-junction power device with reduced miller capacitance in which processing steps can be simplified.

To this end, the invention provides a method according to one embodiment of the invention for fabricating a super-junction semiconductor power device with reduced Miller capacitance. First, an N-type substrate serving as a drain of the super-junction power device is provided and a P-type epitaxial layer is formed on the N-type substrate. Next, at least a trench is formed in the P-type epitaxial layer within a cell region followed by forming a buffer layer on an interior surface in the trench. An N-type dopant layer fills the trench and then the N-type dopant layer is etched to form a recessed structure at an upper portion of the trench. A gate oxide layer is formed in the recessed structure, and simultaneously, dopants in the N-type dopant layer diffuse into the P-type epitaxial layer through the buffer layer, forming an N-type diffusion layer. Finally, a gate conductor fills the recessed structure and an N-type source doped region is formed around the gate conductor in the P-type epitaxial layer.

According to another aspect, a method for fabricating a super-junction semiconductor power device with reduced Miller capacitance is provided according to the following sequence: providing an N-type substrate serving as a drain of the super-junction power device; forming a P-type epitaxial layer on the N-type substrate and at least a trench in the P-type epitaxial layer within a termination region; forming a buffer layer on an interior surface in the trench; filling the trench with an N-type dopant layer; etching the N-type dopant layer to form a recessed structure at an upper portion of the trench; forming a gate oxide layer in the recessed structure, and simultaneously, making dopants in the N-type dopant layer diffuse into the P-type epitaxial layer through the buffer layer, forming an N-type diffusion layer; finally, removing the gate oxide layer from the termination region and filling a gate conductor into the recessed structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale, and some dimensions are exaggerated in the figures for clarity of presentation. Also, where multiple embodiments are disclosed and described as having some features in common, like or similar features will usually be described with like reference numerals for ease of illustration and description thereof.

Figure 1:
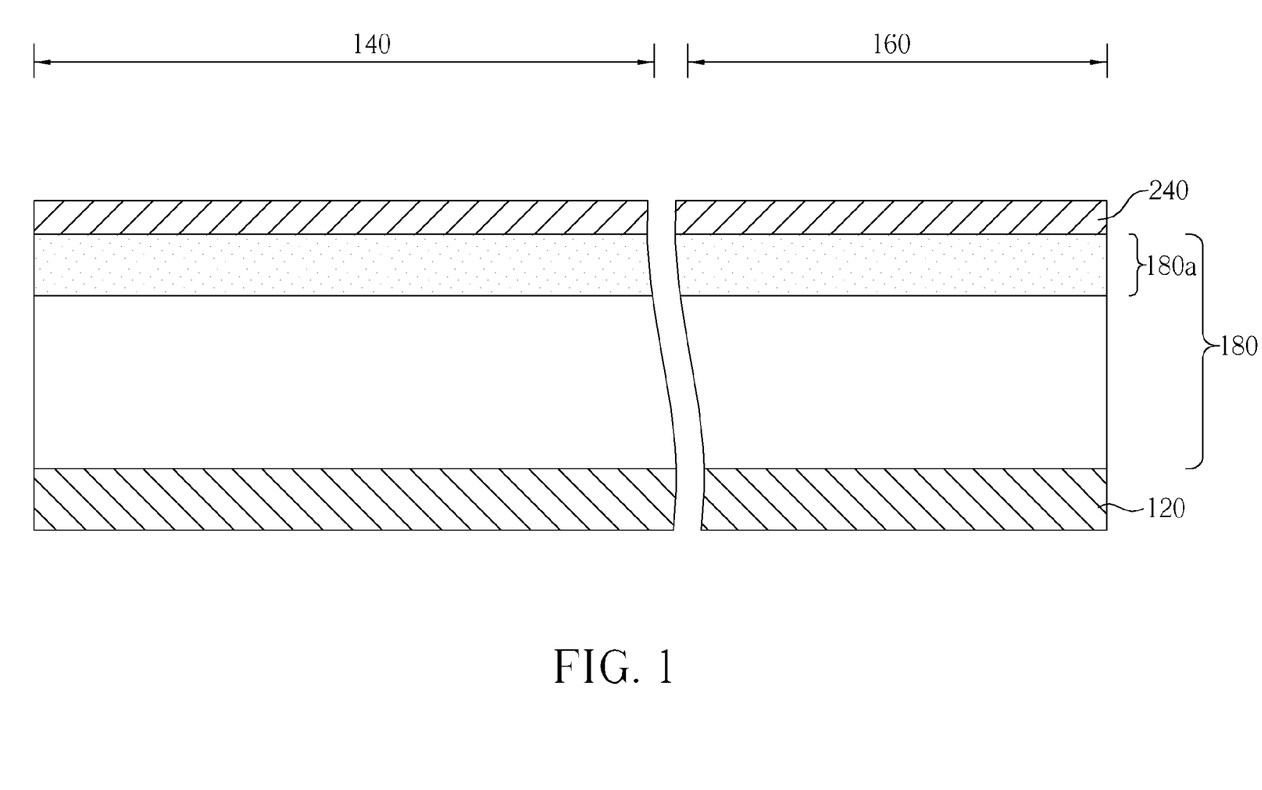
FIGS. 1-8 are schematic, cross-sectional diagrams showing a method for fabricating a super-junction power device with reduced Miller capacitance according to one embodiment of the invention.

FIGS. 1-8 are schematic, cross-sectional diagrams showing a method for fabricating a super-junction power device with reduced Miller capacitance according to one embodiment of the invention. In a preferred embodiment of this invention, as shown in FIG. 1, an N-type substrate 120 defined with a cell region 140 and a termination region 160 is provided, wherein the cell region 140 is used to accommodate a semiconductor device with switching ability, such as a MOSFET, and the termination region 160 comprises a voltage sustaining structure which functions as a barrier for preventing the spreading of the high intensity electric field generated from the cell region 140. By applying an epitaxial growth process, a P-type epitaxial layer 180 is grown on the N-type substrate 120. Optionally, after the formation of the P-type epitaxial layer 180, an ion implantation process may be further carried out to form a P-type well 180a at a certain region within the upper portion of the P-type epitaxial layer 180. It is preferable that the doping concentration of the P-type well 180a is higher than that of the P-type epitaxial layer 180. The above-mentioned epitaxial growth process may adopt a chemical vapor deposition (CVD) process or any other appropriate methods. Next, a hard mask layer 240 is formed on the P-type epitaxial layer 180 to protect part of the P-type epitaxial layer 180 from damage in the following etching process. The hard mask layer 240 may include silicon nitride ($Si_3N_4$) or silicon oxide ($SiO_2$), but is not limited thereto.

Figure 2:
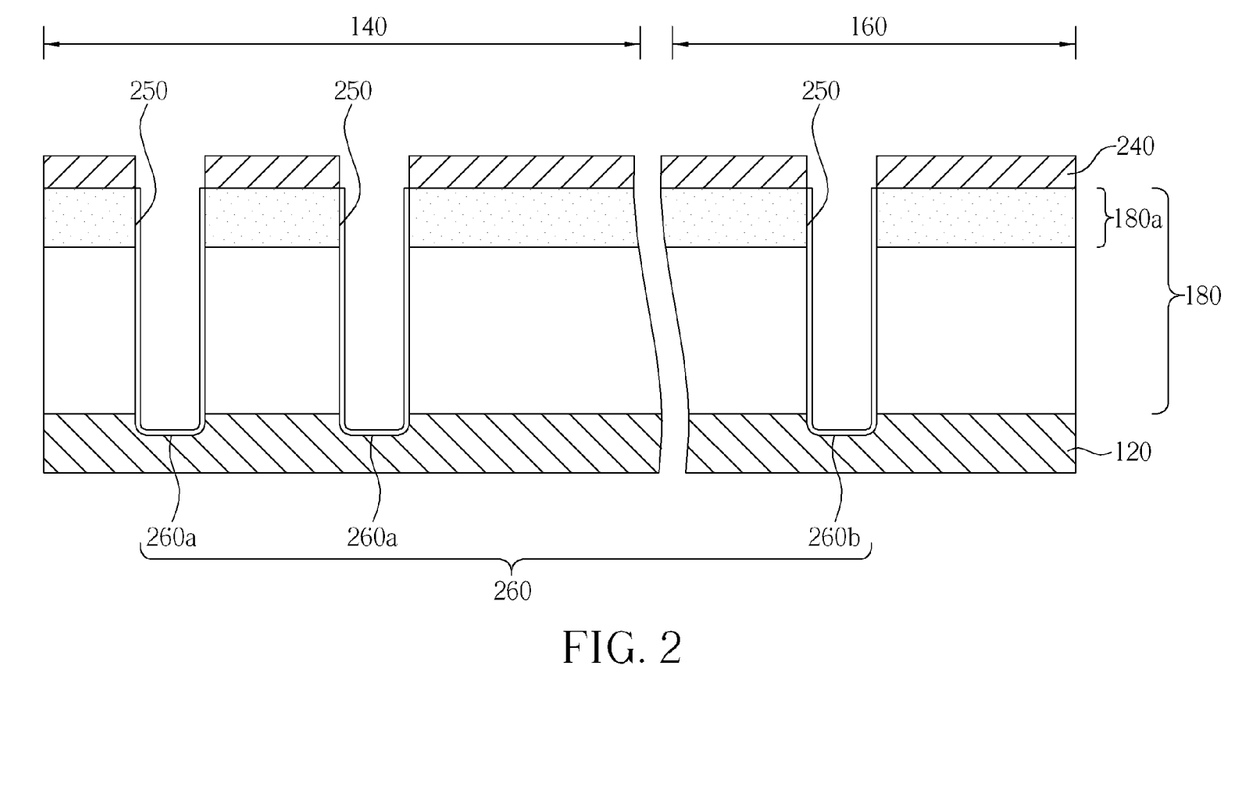

Next, a photolithography and an etching process are carried out to etch at least a trench 260 including 260a and 260b into the hard mask 240 and the P-type epitaxial layer 180 within the cell region 140 and the termination region 160, as shown in FIG. 2. It should be noted that, according to this embodiment, the bottom of the trench 260 is located in the N-type substrate 120. By performing a thermal oxidation method or other similar methods, a buffer layer 250 is formed on the interior surface of the trench 260, wherein the buffer layer 250 includes silicon oxide. It is not recommended to adopt oxynitride or nitride material in the buffer layer 250 as oxynitride may create defects for trapping electrons and nitride materials may impose stress on an interface.

Figure 3:
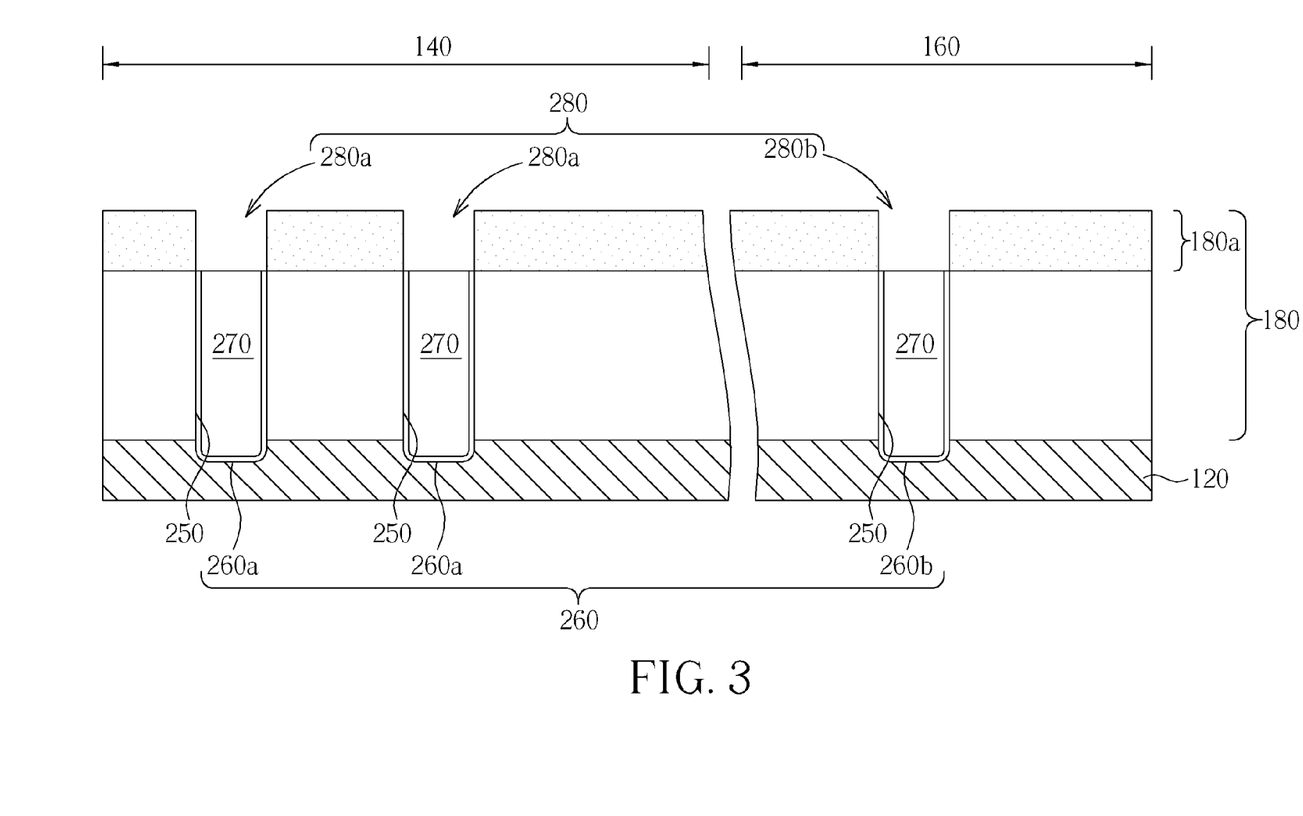

As depicted in FIG. 3, an N-type dopant layer 270 is disposed on the surface of the P-type epitaxial layer 180 and fills up the trench 260. The composition of the dopant layer 270 may be arsenic silicate glass (ASG), but is not limited thereto. An etching back process is carried out to completely remove the dopant layer 270 located on the hard mask layer 240 (not shown) and a recessed structure 280 is further formed at the upper part of the trench 260 concurrently. The recessed structure 280 includes at least a recessed structure 280a within the cell region 140 and at least a recessed structure 280b within the termination region 160, wherein the depth of the trench 280 is approximately equal to the junction depth of the P-well 180a. Optionally, a chemical mechanical polishing (CMP) process can be adopted before the performance of the etching back process described above. The following steps form a channel (not shown) around the interior surface of the recessed structure 280a and further modulate the threshold voltage ($V_{th}$) thereof. These processes are described as follows: a photolithography and etching process are performed followed by applying a tilted angle ion implantation to form the channel (not shown), wherein the threshold voltage of the channel may be modulated by a doping degree of the channel. Finally, the hard mask layer 240 is removed completely to expose the surface of the P-type epitaxial layer 180.

Figure 4:
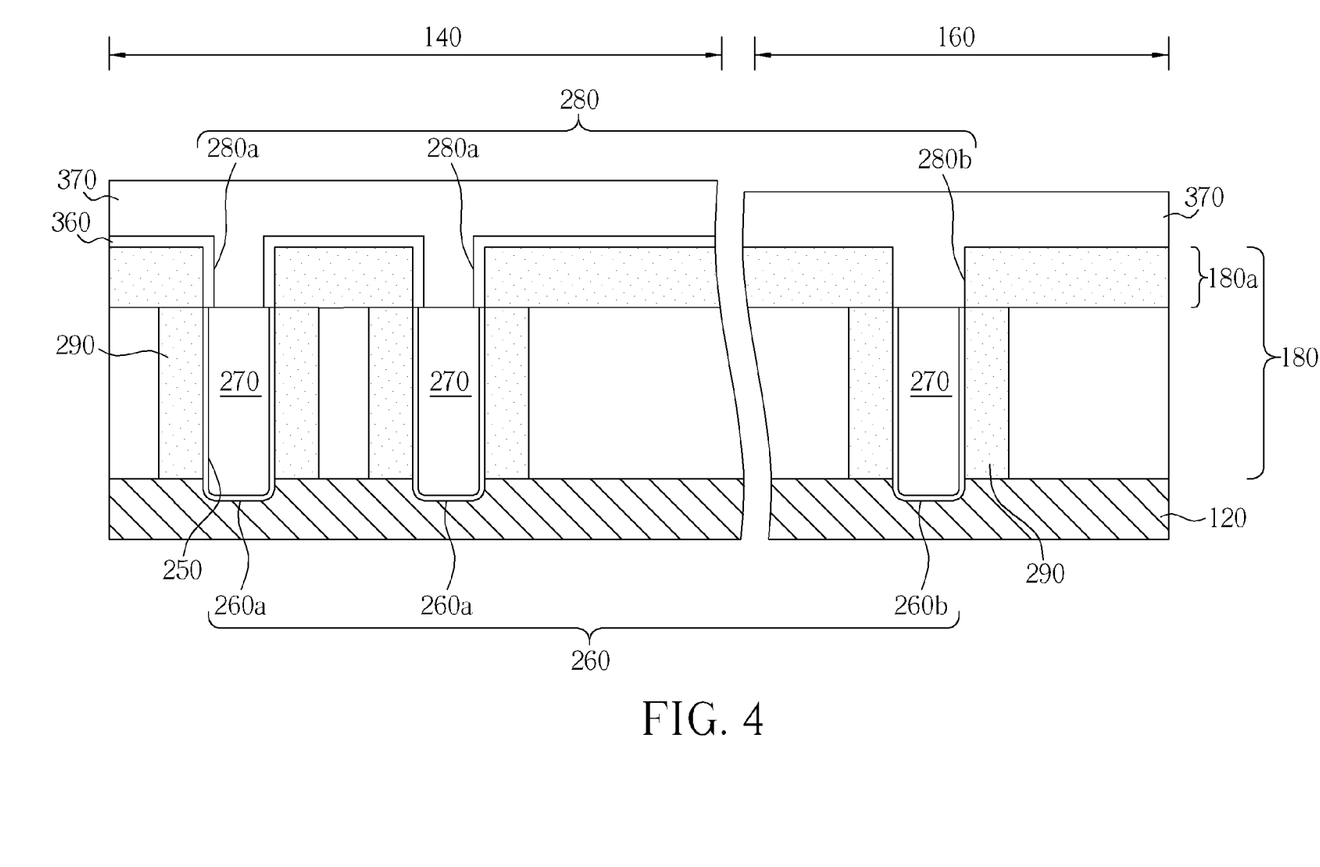

Referring to FIG. 4, a gate oxide layer 360 is formed conformally on the surface of the P-type epitaxial layer 180 and on the interior surface of the recessed structure 280. When the gate oxide layer 360 is formed, dopants inside the dopant layer 270 diffuse into the P-type epitaxial layer 180 concurrently. Therefore, an N-type diffusion layer 290 is formed surrounding the trench 260 in the P-type epitaxial layer 180, the structure of which is called a super junction. Next, an etching process is carried out to remove the gate oxide layer 360 inside the recessed structure 280b. A gate conductor 370 used to control the on-off state of the channel (not shown) is formed to cover the surface of the epitaxial layer 180 and fills up the recessed structure 280 within the cell region 140 and the termination region 160, wherein the gate conductor 180 includes polysilicon or other suitable conductive material.

Figure 5:
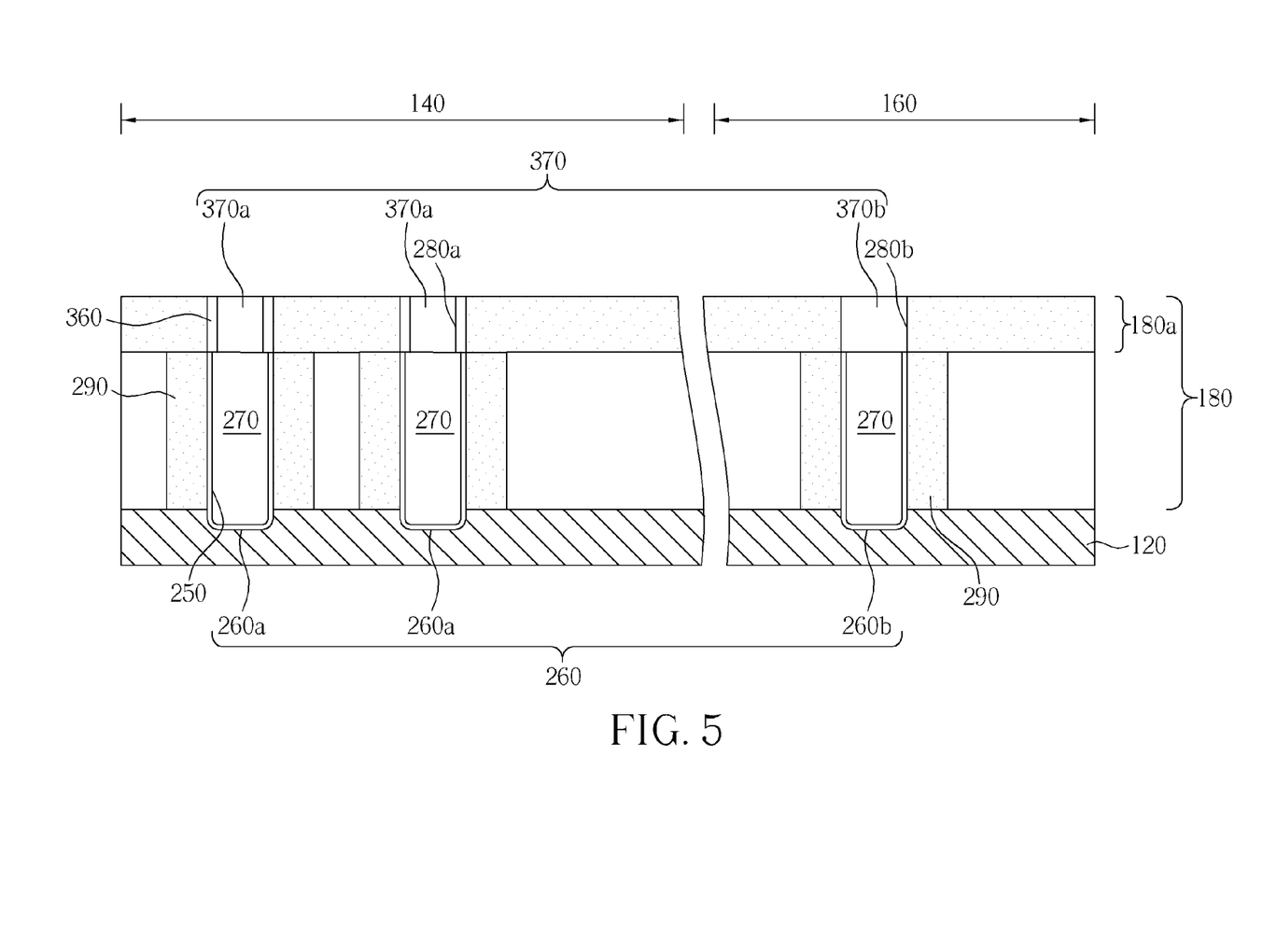

A chemical mechanical polishing (CMP) process and etching back process are performed sequentially, as shown in FIG. 5, meaning the gate conductor 370 above the surface of the P-type epitaxial layer 180 can be eliminated completely, and gate structures 370a, 370b are fabricated. It should be noted that the gate conductor 370a inside the recessed structure 280a is in direct contact with the N-type dopant layer 270 and is surrounded by the gate oxide layer. As the gate conductor 370b inside the recessed structure 280b is not surrounded by the gate oxide layer, the gate conductor 370b directly contacts with the P-type epitaxial layer 180 or P-well 180a. The gate conductor 370b functions as a coupling conductor which avoids the occurrence of an abrupt voltage drop within the termination region 160 and further terminates the voltage in the certain area.

Figure 6:
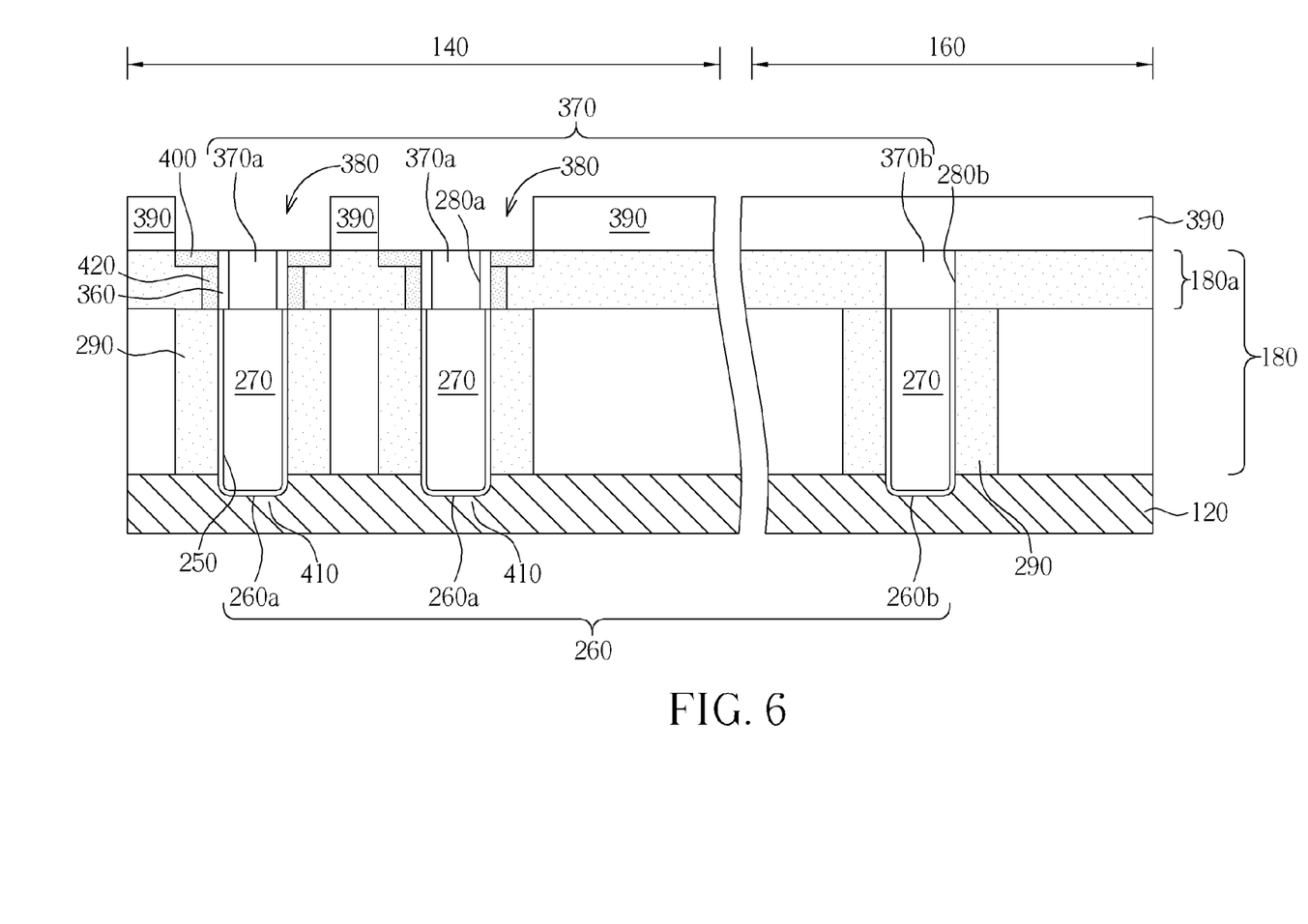

By applying a photolithography process, as shown in FIG. 6, a photoresist pattern 390 is formed to expose an active area 380 within the cell region 140. An ion implantation process is carried out to form an $N^+$ source doped region around the gate conductor 370a in the P-type epitaxial layer 180 or P-type well 180a. Next, the photoresist pattern 390 is removed to expose the portion surface of the P-type epitaxial layer 180. By this point, the structure of the vertical MOSFET 410 is formed, which comprises a gate conductor 370a, a gate oxide 360, an $N^+$ source doped region 400, and an N-type diffusion region 290, wherein a channel 420 is disposed between the $N^+$ source doped region 400 and the N-type diffusion region 290.

Figure 7:
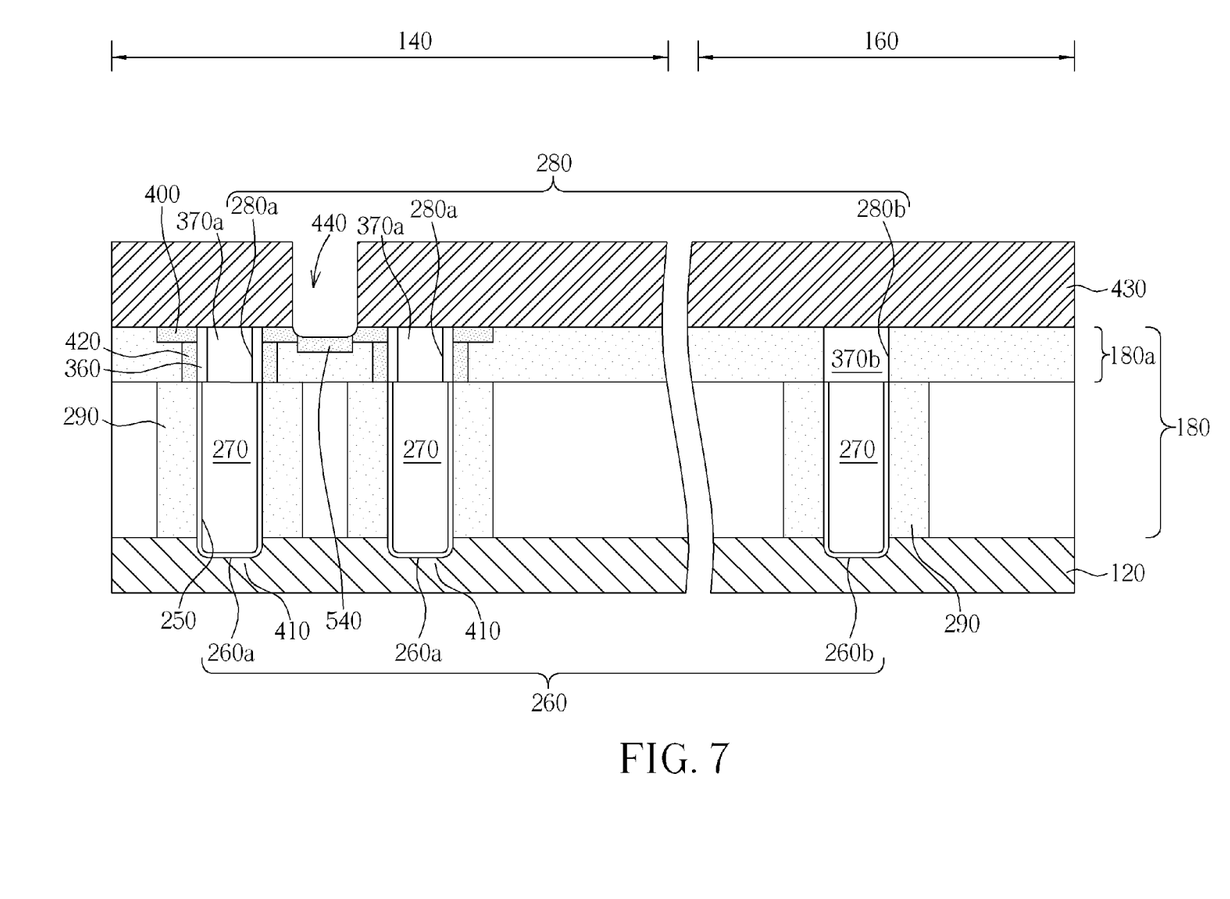

As shown in FIG. 7, a dielectric layer 430 is formed covering all surfaces of the P-type epitaxial layer 180 and those of the gate conductors 370a, 370b within the cell region 140 and the termination region 160. By performing a photolithography and an etching process, at least a contact opening 440 is defined in the cell region 140, which exposes part of the P-type epitaxial layer 180 or P-type well 180a from the bottom of the contact opening 440. In order to improve the conductivity in the interface between metal and semiconductor, an ion implantation process is performed to form a P-type heavily doped region 540 at the bottom of the contact opening 440 followed by an anneal process to activate dopants in the P-type heavily doped region 540.

Figure 8:
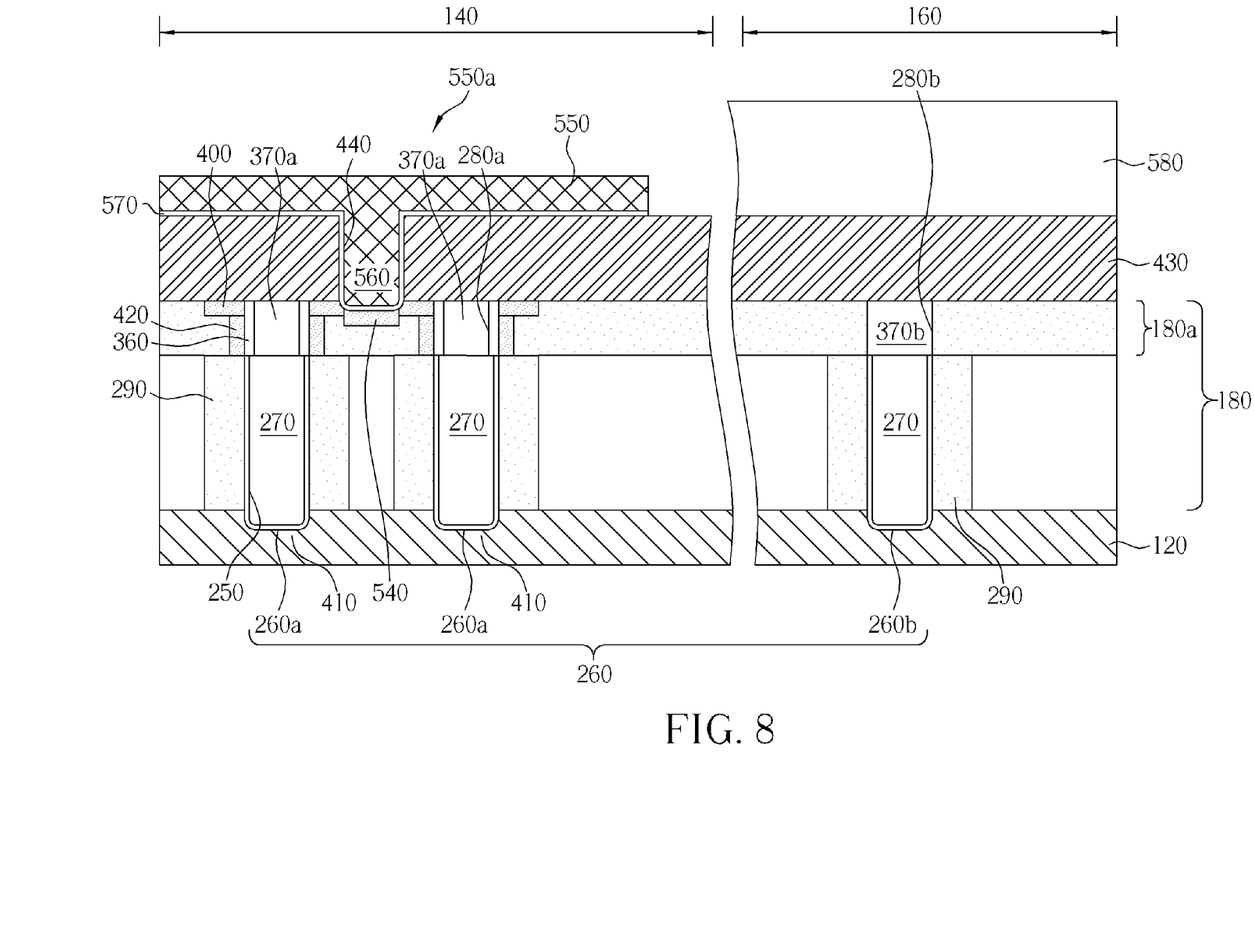

As shown in FIG. 8, a metal layer 550 is deposited within the cell region 140 and the termination region 160 by sputter deposition or electron beam deposition etc. The metal layer 550 fills the contact opening 440 and therefore forms a source conductor 560, wherein the metal layer 550 includes titanium, aluminum, tungsten, titanium nitride or other metal or metal composite. Before the filling of the metal layer 550, a barrier layer 570 may be formed which can prevent metal atoms inside the metal layer 550 from electro-migrating or diffusing into the P-type epitaxial layer 180. Another photolithography process is performed to remove a part of the metal layer 550, thereby forming at least a source pattern 550a. Finally, a protecting layer 580 covering the termination region 160 is formed. As a result, the super-junction power device with reduced Miller capacitance is formed.

Figure 9:
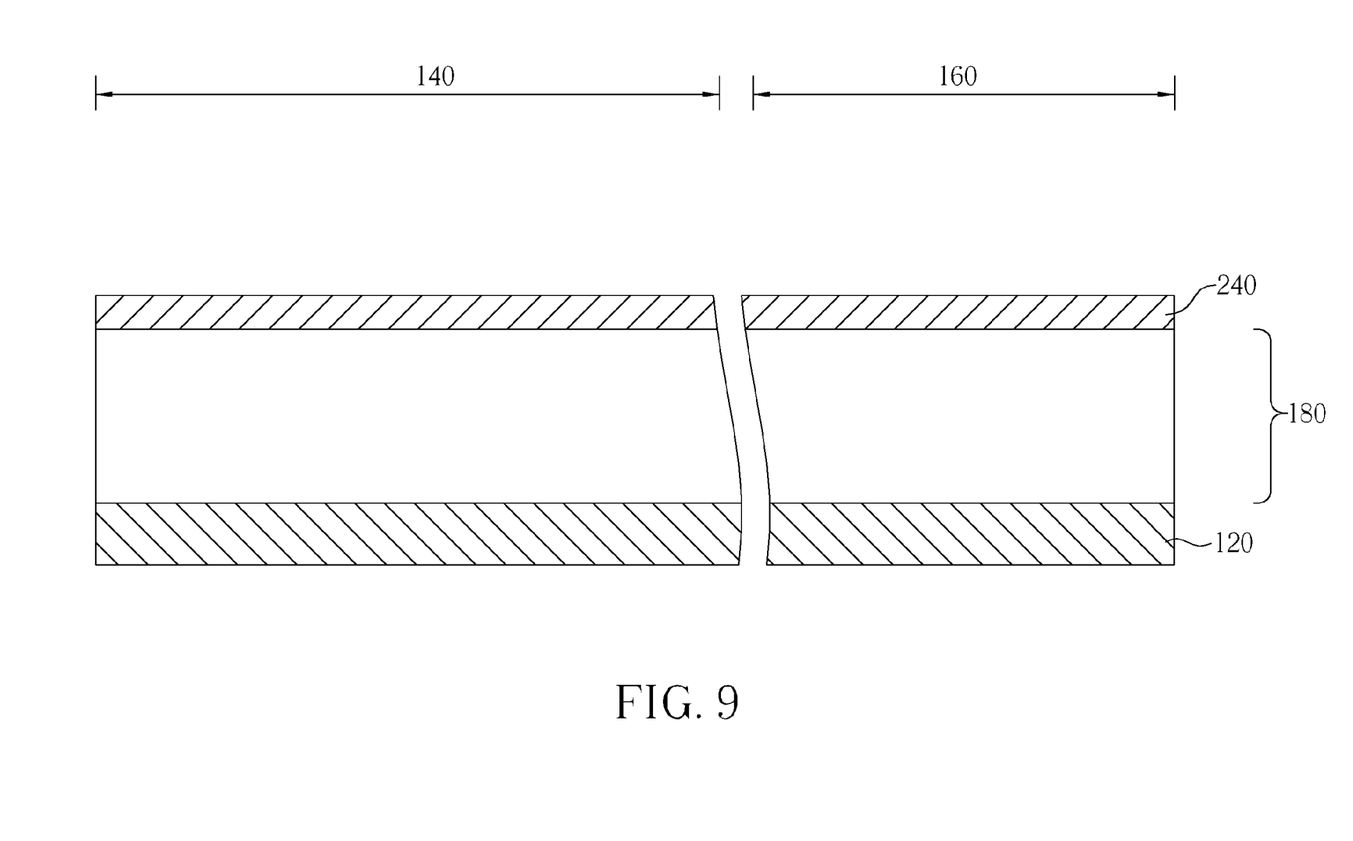
FIGS. 9-11 are schematic, cross-sectional diagrams showing a method for fabricating a super-junction power device with reduced Miller capacitance according to another embodiment of the invention.
Figure 10:
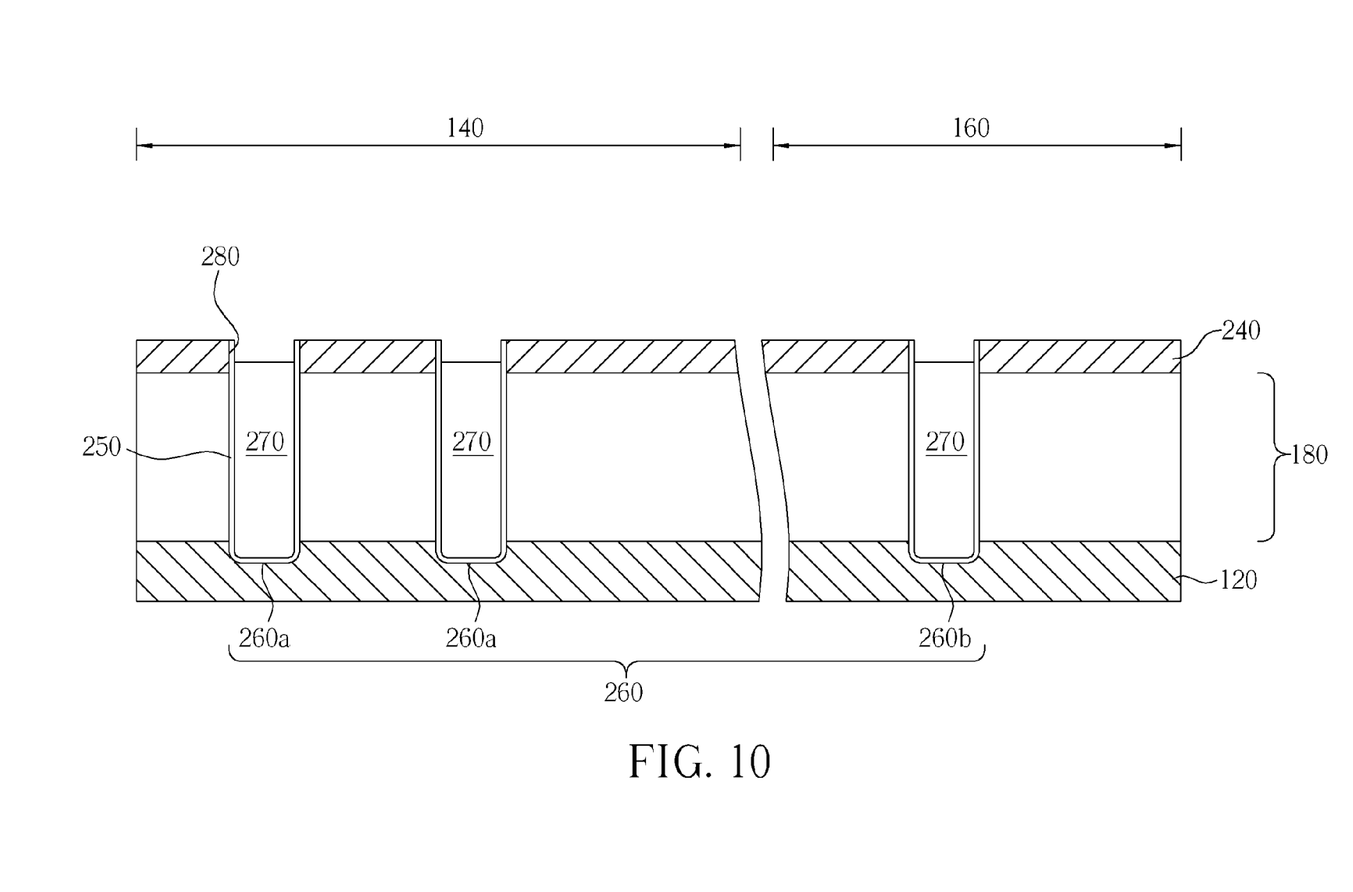
Figure 11:
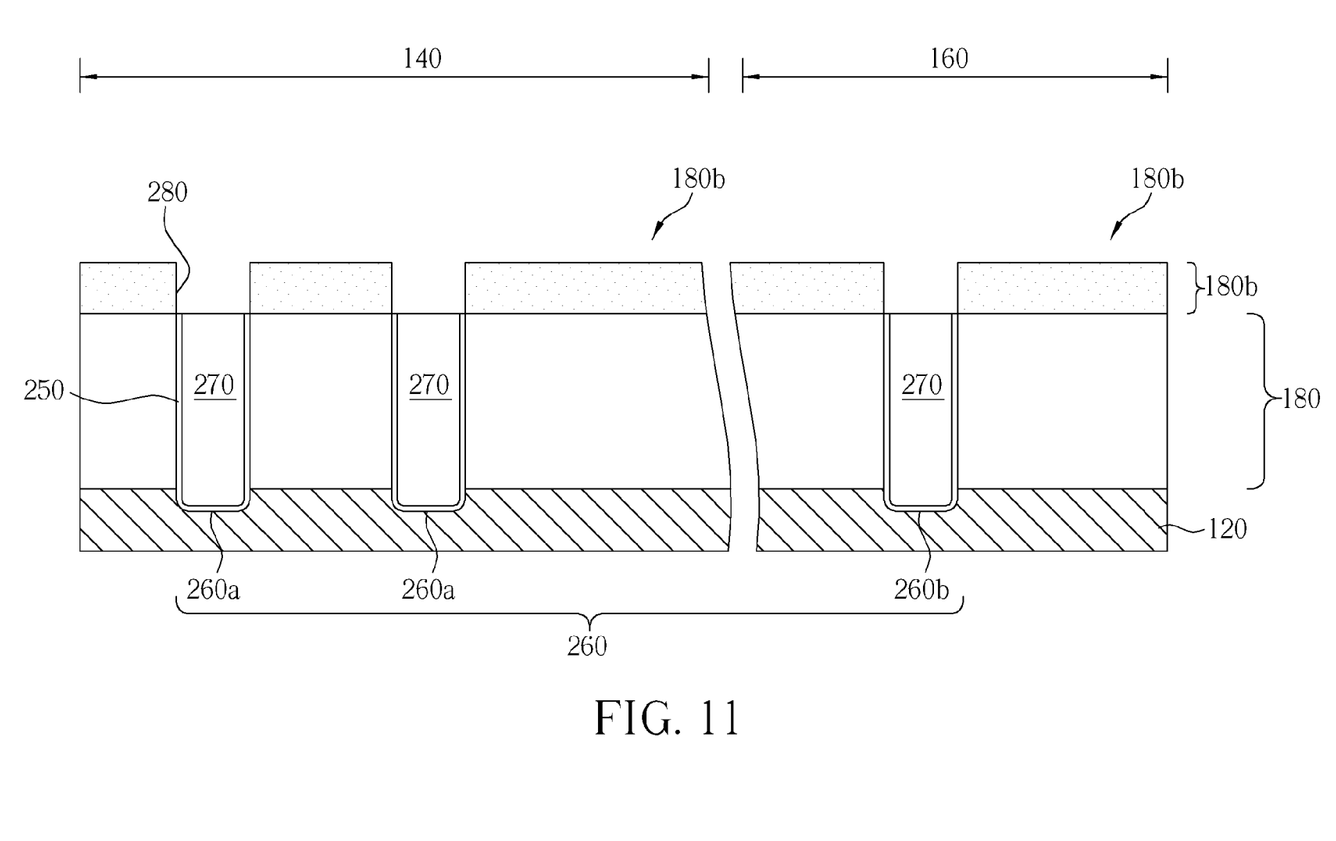

FIGS. 9-11 are schematic, cross-sectional diagrams showing a method for fabricating a super-junction power device with reduced Miller capacitance according to another embodiment of the invention. The only difference between the first embodiment and the second embodiment is that the P-type well 180b is grown on the surface of the P-type epitaxial layer 180 by an epitaxial growth process rather than being formed inside the P-type epitaxial layer 180. Therefore, the following description will focus on the difference between these two embodiments, wherein like or similar features will be described with like reference numerals for ease of illustration and description thereof.

As illustrated in FIG. 9, an N-type substrate 120 defined with a cell region 140 and a termination region 160 is provided, wherein the cell region 140 is used to accommodate a semiconductor device with switching ability, such as MOSFET and the termination region 160 comprises a voltage sustaining structure which can function as a barrier for preventing the spreading of the high intensity electric field generated from the cell region 140. Next, by applying an epitaxial growth process, a P-type epitaxial layer 180 is grown on the N-type substrate 120. The above-mentioned epitaxial growth process may adopt a chemical vapor deposition (CVD) process or any other appropriate methods. A hard mask layer 240 is formed on the P-type epitaxial layer 180 to protect part of the P-type epitaxial layer 180 from damage in the following etching process. The hard mask layer 240 may include silicon nitride ($Si_3N_4$) or silicon oxide ($SiO_2$).

Next, as illustrated in FIG. 10, a photolithography and an etching process are carried out to etch at least a trench 260 including 260a and 260b into the hard mask 240 and the P-type epitaxial layer 180 within the cell region 140 and the termination region 160. It should be noted that, according to this embodiment, the bottom of the trench 260 is located in the N-type substrate 120. A buffer layer 250 is formed on the interior surface of the trench 260, wherein the buffer layer 250 may be formed by a thermal oxidation method or other similar methods. It is recommended to adopt silicon oxide as the buffer layer 250: oxynitride or nitride material are not suitable for the buffer layer 250 as oxynitride may create defects for trapping electrons and nitride materials may impose stress on an interface. Next, an N-type dopant layer 270 is disposed on the surface of the P-type epitaxial layer 180 and fills up the trench 260. The composition of the N-type dopant layer 270 may be arsenic silicate glass (ASG), but is not limited thereto. An etching back process is carried out to completely remove the dopant layer 270 located on the hard mask layer 240 and the surface of the N-type dopant layer is approximately located between the surface of the hard mask layer 240 and that of the P-type epitaxial layer 180.

Please refer to FIG. 11. The hard mask layer 240 is removed to expose the surface of the P-type epitaxial layer 180. A chemical mechanical polishing (CMP) process or etching back process is adopted to laminate the protruding portion of the dopant layer 270 so that the surface of the N-type dopant layer 270 is aligned with that of the P-type epitaxial layer 180. Next, by applying an epitaxial growth process, a P-type well 180b is formed above the P-type epitaxial layer 180. A recessed structure 280 is formed in the P-type well 180b by a photolithography and etching process to expose the part of the N-type dopant layer 270, wherein the bottom of the recessed structure is approximately aligned with the top of trench 260. In this embodiment, because the surface of the N-type dopant layer 270 is almost level with that of the P-type epitaxial layer 180, the threshold voltage of the device may be further improved. The following steps are similar to the steps illustrating in FIGS. 4-8; a detailed description is therefore omitted as this can be ascertained by referring to the previous paragraph.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a super-junction power device with reduced Miller capacitance, comprising:
   providing an n-type substrate serving as a drain of the super-junction power device;
   forming a P-type epitaxial layer on the n-type substrate;
   forming at least a trench in the P-type epitaxial layer within a termination region;
   forming a buffer layer on an interior surface in the trench;
   filling an N-type dopant layer into the trench;
   etching the N-type dopant layer to form a recessed structure at an upper portion of the trench;
   forming a gate oxide layer in the recessed structure, and simultaneously making dopants in the N-type dopant layer diffuse into the P-type epitaxial layer through the buffer layer to form an N-type diffusion layer;
   removing the gate oxide layer from the termination region; and
   filling a gate conductor into the recessed structure.

2. The method for fabricating a super-junction power device with reduced Miller capacitance according to claim 1, wherein the gate conductor is in direct contact with the P-type epitaxial layer.

3. The method for fabricating a super-junction power device with reduced Miller capacitance according to claim 1, further comprising:
   forming a P-type well in the P-type epitaxial layer.

4. The method for fabricating a super-junction power device with reduced Miller capacitance according to claim 3, wherein the gate conductor is in direct contact with the P-type well.

5. The method for fabricating a super-junction power device with reduced Miller capacitance according to claim 1, wherein the gate conductor comprises polysilicon.

6. The method for fabricating a super-junction power device with reduced Miller capacitance according to claim 1, wherein the gate conductor is in direct contact with the N-type dopant layer.

7. The method for fabricating a super-junction power device with reduced Miller capacitance according to claim 1, wherein the buffer layer is formed by thermal oxidation.

8. The method for fabricating a super-junction power device with reduced Miller capacitance according to claim 1, wherein the buffer layer comprises silicon oxide.

9. The method for fabricating a super-junction power device with reduced Miller capacitance according to claim 1, wherein the N-type dopant layer comprises arsenic-doped silicate glass.

10. The method for fabricating a super-junction power device with reduced Miller capacitance according to claim 1, wherein the trench reaches the N-type substrate.

11. The method for fabricating a super-junction power device with reduced Miller capacitance according to claim 1, further comprising:
    forming a dielectric layer within the termination region to cover the P-type epitaxial layer and the gate conductor.

* * * * *